US009337562B1

(12) United States Patent

Kuo et al.

(10) Patent No.: US 9,337,562 B1
(45) Date of Patent: May 10, 2016

(54) PRESSABLE PORTABLE STORAGE DEVICE

(71) Applicant: ADATA TECHNOLOGY CO., LTD., New Taipei (TW)

(72) Inventors: Tsung Hsing Kuo, Taipei (TW); Chia-Hsiang Hsiao, New Taipei (TW)

(73) Assignee: ADATA TECHNOLOGY CO., LTD., New Taipei (TW)

(*) Notice: Subject to any disclaimer, the term of this patent is extended or adjusted under 35 U.S.C. 154(b) by 0 days.

(21) Appl. No.: 14/633,291

(22) Filed: Feb. 27, 2015

(30) Foreign Application Priority Data

Dec. 10, 2014 (TW) ............................ 103143141 A

(51) Int. Cl.
*H01R 13/44* (2006.01)
*H05K 5/00* (2006.01)
*H05K 7/00* (2006.01)
*G06F 12/02* (2006.01)

(52) U.S. Cl.
CPC ..................................... *H01R 13/44* (2013.01)

(58) Field of Classification Search
CPC ........... H01R 13/44; H05K 5/00; H05K 7/00; H05K 1/14; G06F 12/02
See application file for complete search history.

(56) References Cited

U.S. PATENT DOCUMENTS 6,579,108 B1 * 6/2003 Goff ..................... H01R 12/716 439/131
7,361,032 B2 * 4/2008 Loftus ................ H01R 13/4538 439/131
7,704,084 B1 * 4/2010 Cheng .................. H01R 13/447 439/131
7,869,219 B2 * 1/2011 Ma ..................... G11C 11/5621 361/737
8,043,101 B2 * 10/2011 Zhang ................ H01R 13/4538 439/133
8,345,417 B2 * 1/2013 Lo ........................ H05K 5/0278 361/679.31
8,568,151 B2 * 10/2013 Cheng ................... G06F 1/1656 361/679.38
8,747,127 B2 * 6/2014 Zhou .................... H01R 13/635 439/131
2007/0093093 A1 * 4/2007 Lev .................... H01R 13/4538 439/131
2008/0076280 A1 * 3/2008 Chi .................... H01R 13/4538 439/131
2009/0275224 A1 * 11/2009 Ni .................... G06K 19/07732 439/131
2010/0124832 A1 * 5/2010 Liu .................... H01R 13/6275 439/131

* cited by examiner

*Primary Examiner* — Gary Paumen
(74) *Attorney, Agent, or Firm* — Li & Cai Intellectual Property (USA) Office

(57) ABSTRACT

A pressable portable storage device includes an outer housing, a main body fixedly accommodated inside the outer housing, an inner housing slidably accommodated in a sliding space between the main body and the outer housing, an elastic unit connected between the main body and the inner housing, and a linear spring. The main body has a terminal port exposed outside the outer housing. The inner wall of the outer housing is formed with a protrusion. The linear spring has a first end disposed on the inner housing and a second end formed with a guiding hook pointing toward the inner wall of the outer housing. When the inner housing slides to sleeve the terminal port, the guiding hook moves along an outer edge of the protrusion to drive the linear spring to deform for providing a first spring force, and the elastic unit deforms for providing a second spring force.

10 Claims, 6 Drawing Sheets

PRESSABLE PORTABLE STORAGE DEVICE

BACKGROUND OF THE INVENTION

1. Field of the Invention

The present disclosure relates to a portable storage device, and pertains particularly to a pressable portable storage device.

2. Description of Related Art

Portable storage devices are well known for use in conjunction with personal computers and computer peripherals (e.g. printers). A portable storage device can be used as a transmission medium of information between different storage devices. Structurally, a portable storage device includes a housing and a data storage circuit unit accommodated therein. The circuit unit has a terminal port exposed outside an opening of the housing for connection to the connectors of other devices. A developed industry standard that defines the terminal port is universal serial bus (USB).

When the portable storage device is not plugged to other connectors for connection, the terminal port is completely exposed outside the housing. It is likely that the exposed terminal port is deformed or defaced, resulting in the portable storage device not operating normally.

SUMMARY OF THE INVENTION

The embodiment of the instant disclosure provides a pressable portable storage device including an outer housing, a main body, an inner housing, an elastic unit, and a linear spring. The outer housing has an inner wall formed with a protrusion, and the protrusion has an end formed with an indented face. The main body is fixedly accommodated inside the outer housing and has a terminal port and at least one fixing portion. The terminal port is exposed outside the outer housing, and the main body is fixedly connected to the outer housing through the fixing portion. The inner housing is slidably accommodated in a sliding space between the main body and the outer housing. The elastic unit is connected between the main body and the inner housing. The linear spring has a first end and a second end, wherein the first end is fixedly connected to the inner housing, the second end is formed with a guiding hook protruding toward the inner wall of the outer housing, and the linear spring is configured to swing along a first direction. When the inner housing slides along a second direction to sleeve the terminal port, the guiding hook moves along an outer edge of the protrusion to drive the linear spring to swing along the first direction to deform for providing a first spring force and the elastic unit provides a second spring force to the inner housing.

In accordance with the instant embodiment, when the inner housing slides toward the terminal port of the main body, the inner housing sleeves the terminal port; and when the inner housing slides away from the terminal port of the main body, the terminal port is exposed for plugging to other connectors. When the user applies a force to the outer housing for pulling the plugged terminal port out of the connector of another electronic device, the inner housing would not be triggered to move relatively with respect to the outer housing.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1:
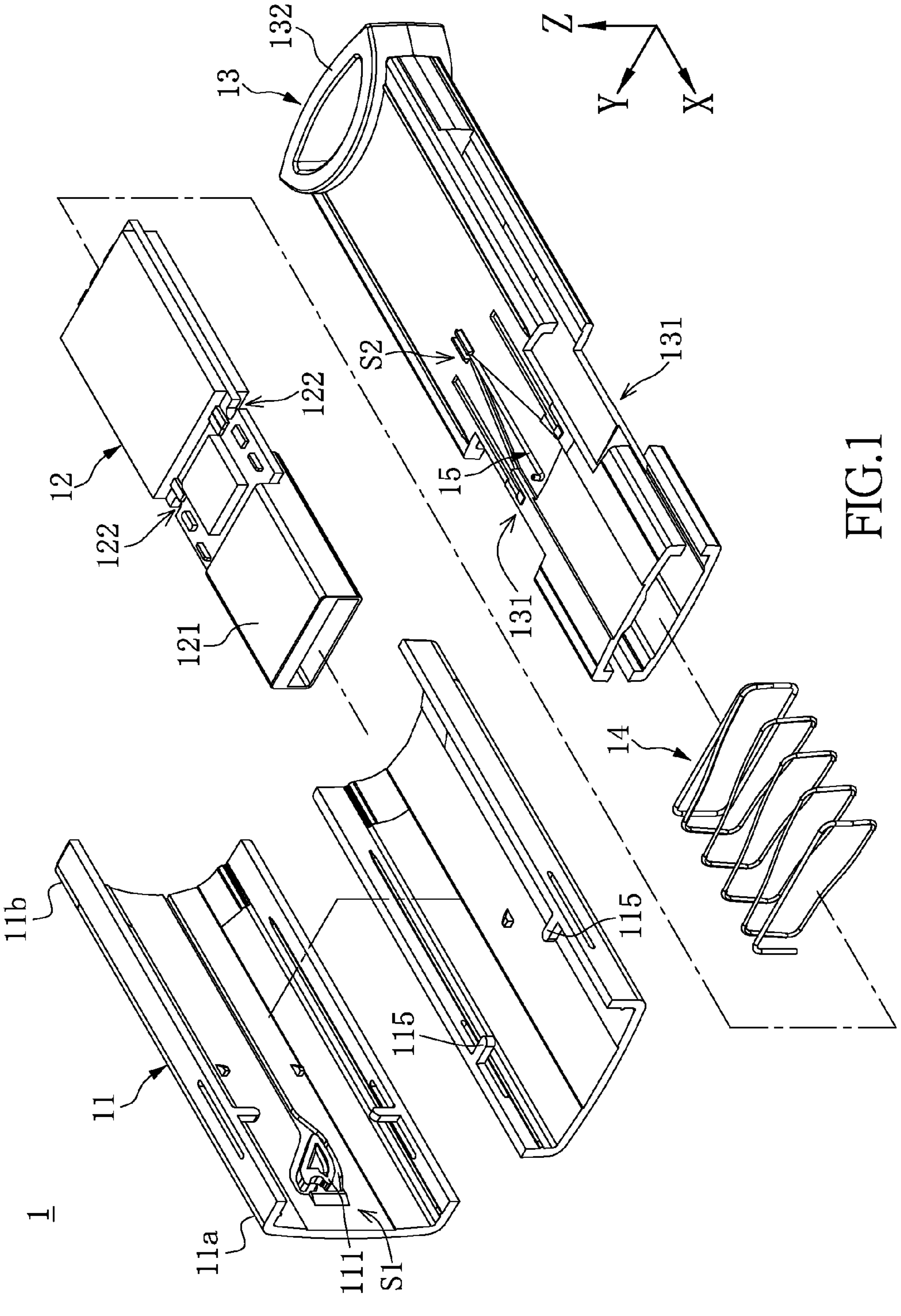
FIG. 1 shows an exploded view of a pressable portable storage device according to an embodiment of the present disclosure.
Figure 2A:
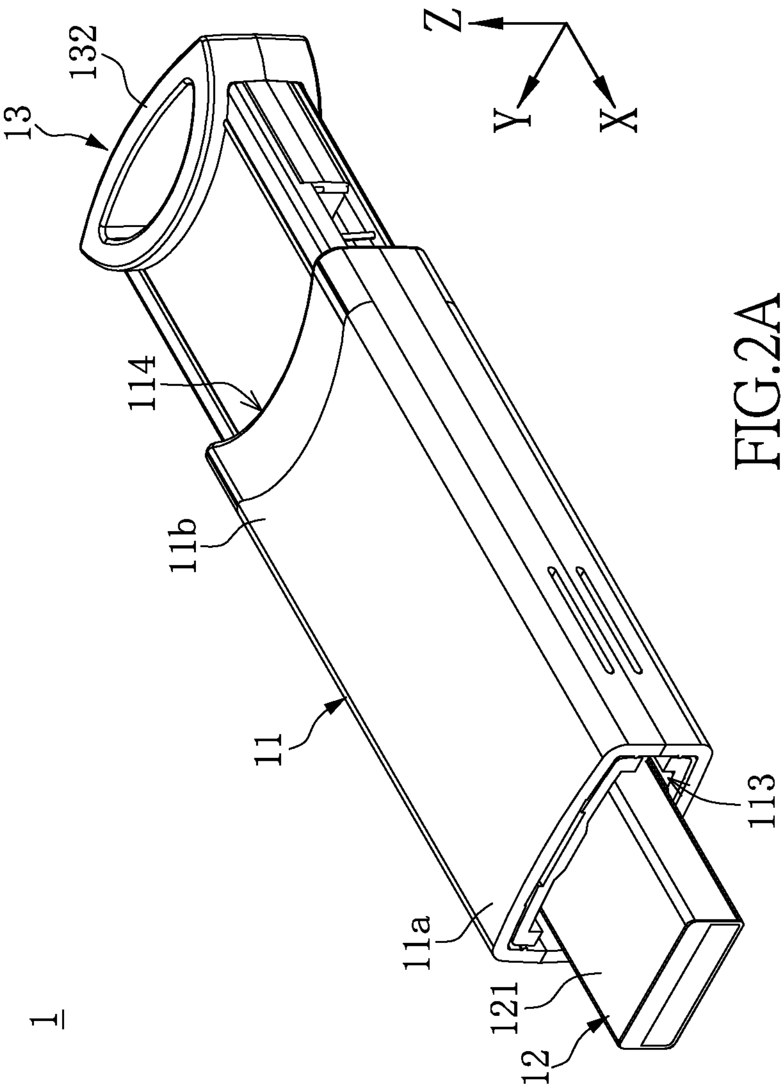
FIG. 2A show a perspective view of the pressable portable storage device of FIG. 1 in a first state.
Figure 2B:
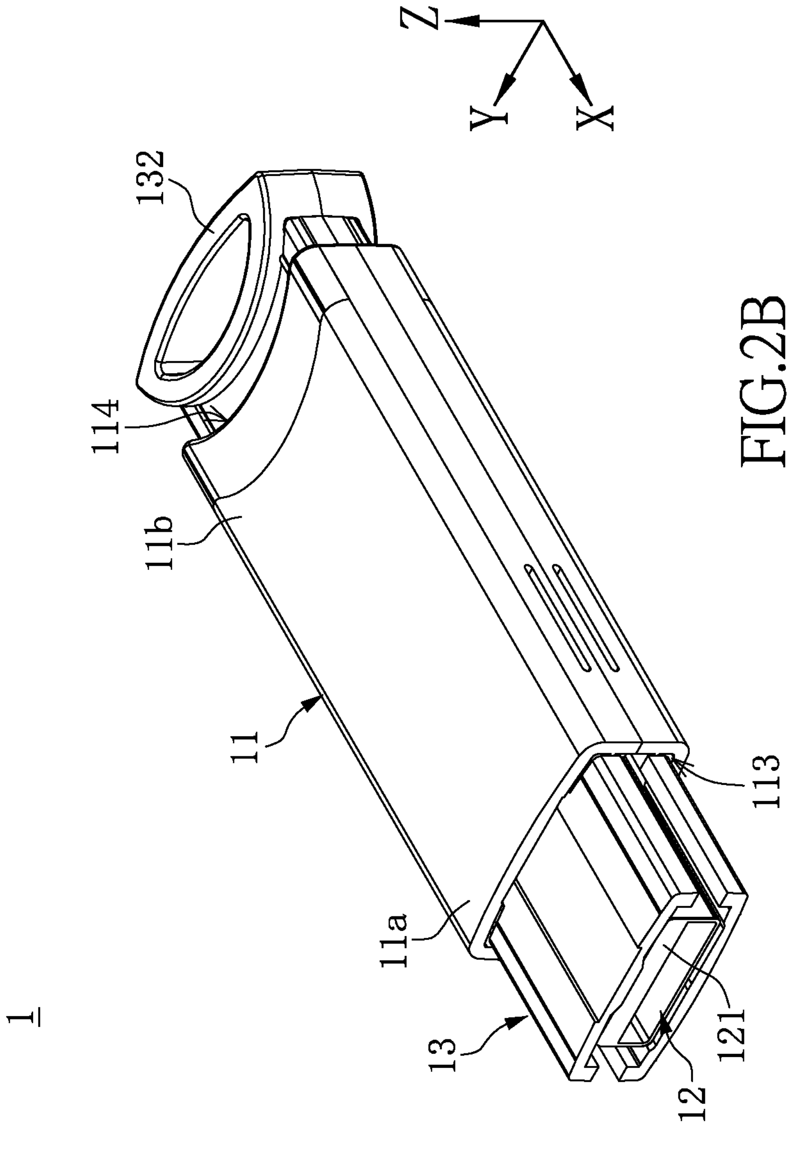
FIG. 2B show a perspective view of the pressable portable storage device of FIG. 1 in a second state.

Please refer to FIG. 1, FIG. 2A and FIG. 2B for explanation of a pressable portable storage device according to the present disclosure. FIG. 1 shows an exploded view of the pressable portable storage device according to an embodiment of the present disclosure. FIG. 2A show a perspective view of the pressable portable storage device of FIG. 1 in a first state. FIG. 2B show a perspective view of the pressable portable storage device of FIG. 1 in a second state. The pressable portable storage device 1 includes an outer housing 11, a main body 12, an inner housing 13, an elastic unit 14, and a linear spring 15. The main body 12 is fixedly accommodated inside the outer housing 11 and has a terminal port 121 exposed outside the outer housing 11 for connection to other electronic devices for storing data. The inner housing 13 is slidably accommodated in a sliding space between the main body 12 and the outer housing 11 and configured to slide back and forth in the sliding space along a second direction, such as the X-axis direction as shown in the Figures. When the inner housing 13 is pushed by an external force provided thereto to slide toward the terminal port 121 and to be held in place against the force provided by the elastic unit 14, which drives the inner housing 13 away from the terminal port 121, through the linear spring 15, the inner housing 13 sleeves the terminal port 121 for protecting the terminal port 121; when the inner housing 13 is pushed again by an external force provided thereto, the linear spring 15 is disengaged and the inner housing 13 is driven to sleeve away from the terminal port 121 by the force provided by the elastic unit 14 and the terminal port 121 is exposed for connection to other devices. (A position of the inner housing 13 when driven by the elastic unit 14 to be furthest away from the terminal port 121 can be defined as an original position of the inner housing 13.)

In the present embodiment, the main body 12 can be a USB connector assembly, and the terminal port 121 of the main body 12 can be a USB port. The terminal port 121 is disposed at a front end of the main body 12 and the terminal port 121 extends from an opening 113 of a front end of the outer housing 11, such as a first end 11_a_ of the outer housing 11, and protrudes outside the outer housing 11. The main body 12 further has at least one fixing portion 122 and the main body 12 is fixedly connected to the outer housing 11 through the fixing portion 122. In the present embodiment, the main body 12 can has two fixing portions 122 respectively disposed at two sides of the main body 12. For example, the fixing portions 122 are fixing slots, and the outer housing 11 has two fixing clips 115 disposed at two sides of an inner wall S1 of the outer housing 11. The positions of the fixing portions 122 are corresponding to the positions of the fixing clips 115. The fixing portions 122 can be fastened to the corresponding fixing clips 115, whereby the main body 12 can be fixedly connected to the outer housing 11.

Figure 3:
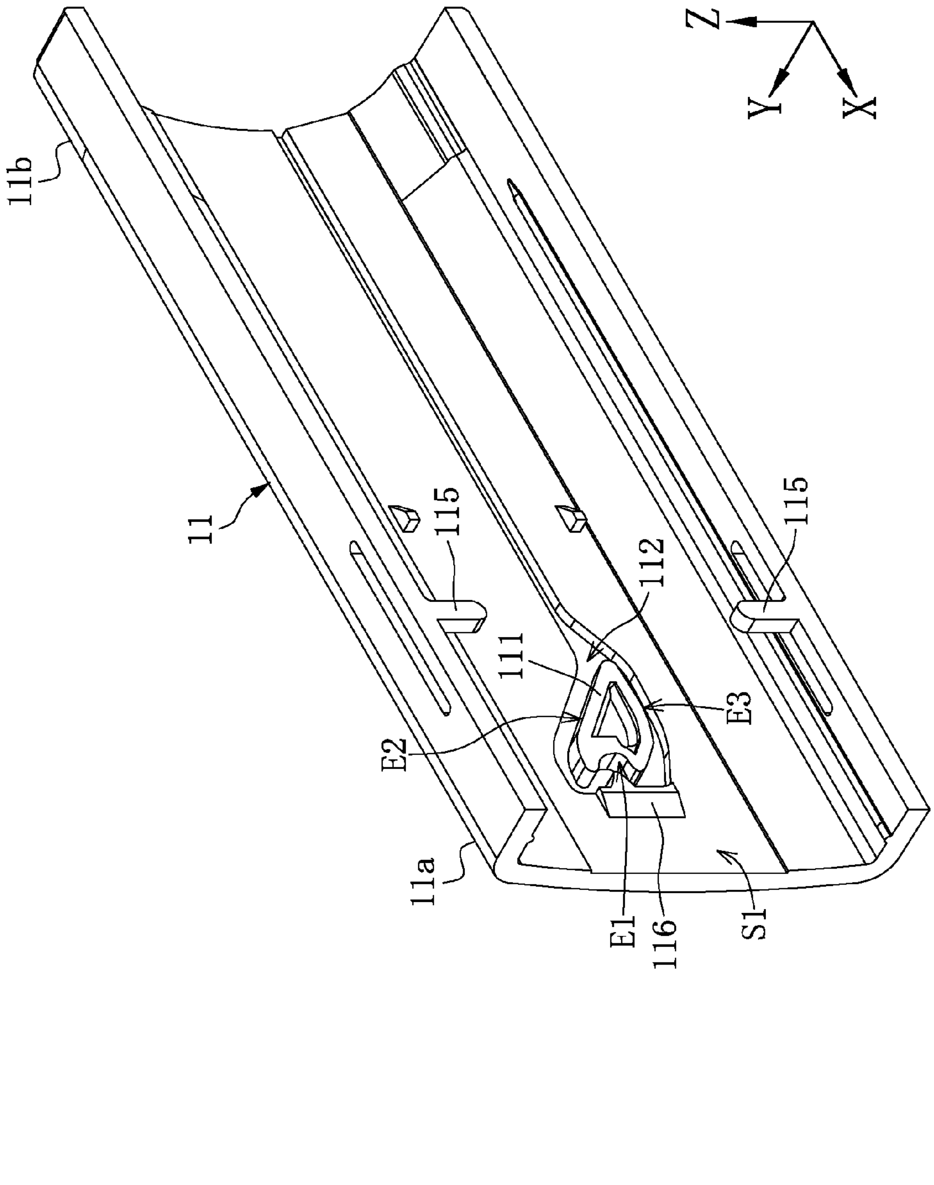
FIG. 3 shows a partial perspective view of an outer housing of the pressable portable storage device of FIG. 1.

Referring to FIG. 1 and FIG. 3, wherein FIG. 3 shows a partial perspective view of an outer housing of the pressable portable storage device of FIG. 1. The outer housing 11 and the main body 12 are configured to be combined together and the sliding space is formed there between. As shown in FIG. 1, the outer housing 11, as a specific example, can include an upper shell and a lower shell. The inner wall S1 of the outer housing 11 is formed with a protrusion 111. Specifically. The protrusion 111 is protruding from the inner wall S1 of the outer housing 11 and into the sliding space (or toward the main body 12), such that the inner wall S1 of the outer housing 11 can be formed with a guiding groove 112 having a flat profile. The end of the protrusion 111 that is proximal to the terminal port 121 is formed with an indented face E1, such that the shape of the portion of an outer edge of the protrusion 111 that is proximal to the terminal port 121 resembles the shape of an “M”. The outer edge of the protrusion 111 is further formed with a first ramp E2 and a second ramp E3 and the indented face E1 is connected between the first ramp E2 and the second ramp E3. As shown in FIG. 3, the shape of the outer edge of the protrusion 111 can resemble the shape of a heart, in which the first ramp E2 is facing away from the terminal port 121, the second ramp E3 and the indented face E1 are facing toward the terminal port 121, and the indented face E1 can be indented along the second direction (e.g. the X-axis direction as shown in the Figures).

The inner housing 13 can sleeve the main body 12 and the inner housing 13 is configured to slide back and forth in the sliding space along the second direction (e.g. the X-axis direction as shown in the Figures). The inner housing 13 can have at least one sliding slot 131. In the present embodiment, the inner housing 13 has two sliding slots 131 respectively positioned at two sides of the inner housing 13. The fixing portions 122 of the main body 12 are respectively positioned in the sliding slots 131. Specifically, each of the fixing portions 122 passes through the corresponding sliding slot 131 for fixedly connecting to the outer housing 11. Each of the fixing portions 122 slides in the corresponding sliding slot 131 along the second direction to move relatively with respect to the inner housing 13 when the inner housing 13 slides along the second direction.

The inner housing 13 further has a pressing portion 132 exposed outside the outer housing 11. The pressing portion is 132 is disposed at a back end of the inner housing 13 and the pressing portion 132 extends from an opening 114 of a back end of the outer housing 11, such as a second end 11*b* of the outer housing 11, and protrudes outside the outer housing 11. The user can provide an external force to the inner housing 13 by hand-holding the outer housing 11 and pressing the pressing portion 132 positioned at the second end 11*b* of the outer housing 11, such that the inner housing 13 can be driven to move relatively with respect to the outer housing 11 and slide toward the terminal port 121. In other words, the inner housing 13 can be driven to move relatively with respect to the main body 12 and slide toward the terminal port 121.

The elastic unit 14 is connected between the main body 12 and the inner housing 13. Specifically, the elastic unit 14, which is a spring as a specific example, can be disposed between the main body 12 and the inner housing 13. One end of the elastic unit 14 sleeves a back end of the main body 12 and fixedly connects to the main body 12. Another end of the elastic unit 14 fixedly connects to an inner wall of the back end of the inner housing 13. When the inner housing 13 is driven to slide toward the terminal port 121, the elastic unit is deformed for providing a second spring force to the inner housing 13, which drives the inner housing 13 to slide away from the terminal port 121 and back to its original position.

Figure 4:
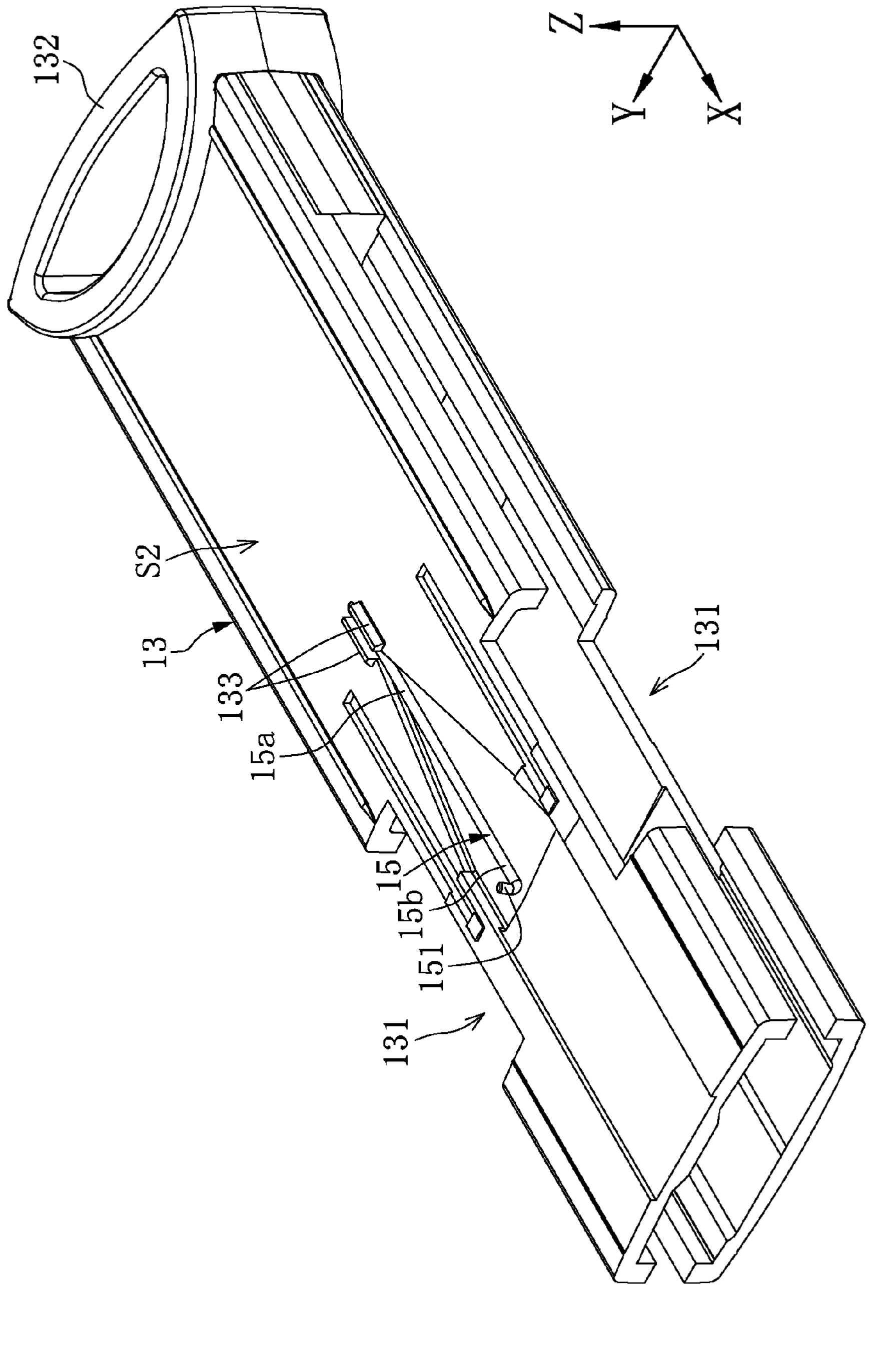
FIG. 4 shows a perspective view of an inner housing and a linear spring of the pressable portable storage device of FIG. 1.
Figure 5A:
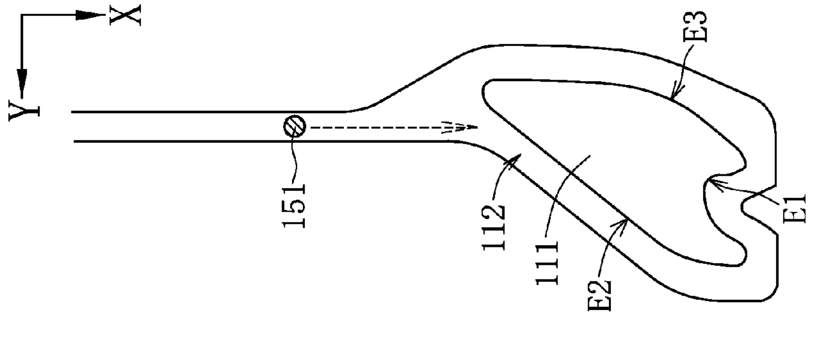
FIG. 5A to FIG. 5D show a guiding hook's movement along an outer edge of a protrusion of the pressable portable storage device of FIG. 1.
Figure 5B:
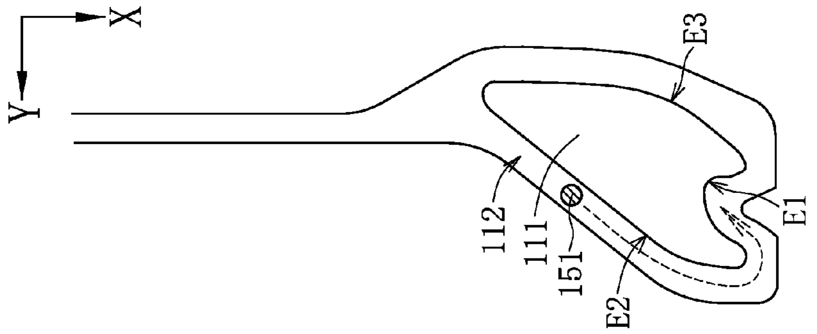
Figure 5C:
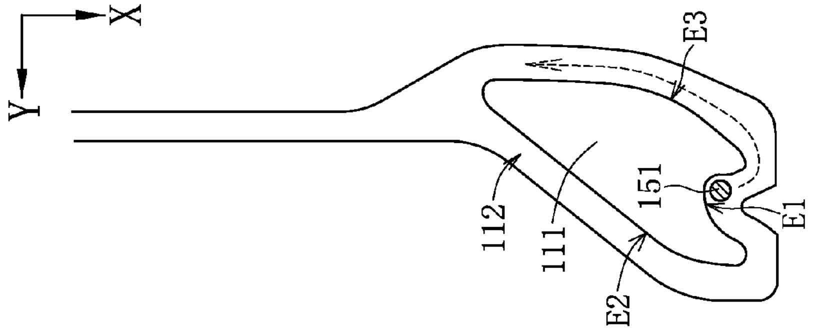
Figure 5D:
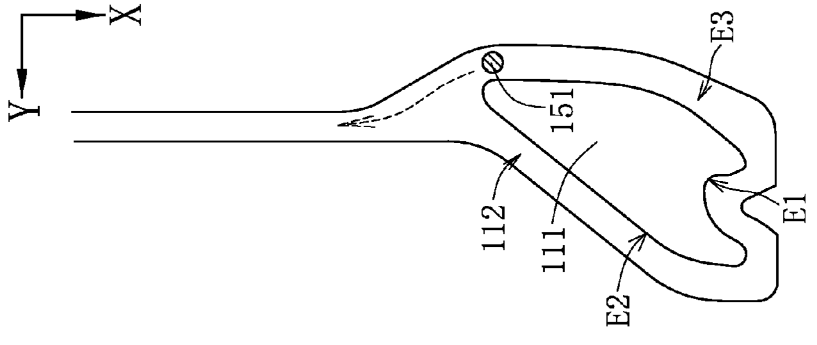

Refer to FIG. 1 and FIG. 4, wherein FIG. 4 shows a perspective view of an inner housing and a linear spring of the pressable portable storage device of FIG. 1. The linear spring 15 has a first end 15*a* and a second end 15*b*. The first end 15*a* is fixedly connected to an outer wall S2 of the inner housing 13. The second end 15*b* is a free end of the linear spring 15 and points toward the terminal port 121. Specifically, the outer wall S2 of the inner housing 13 is facing toward the inner wall S1 of the outer housing 11 and the outer wall S2 of the inner housing 13 is formed with two guiding levers 133 protruding from the outer wall S2 and positioned side by side for clamping the first end 15*a* of the linear spring 15, whereby the first end 15*a* of the linear spring 15 is fixedly connected to the inner housing 13. When the linear spring stays at its original position, the extension direction of the linear spring 15 of can be substantially parallel with the second direction. Accordingly, the linear spring 15 is configured to swing along a first direction (e.g. the Y-axis direction as shown in the Figs).

The linear spring 15 is positioned at a reference plane (which is not shown in the Figs) substantially parallel with the inner wall S1 of the outer housing 11. When the linear spring 15 stays at its original position (non-deformed position), the linear spring 15 has no deformation; when the linear spring 15 swings away from its original position, the deformed linear spring 15 provides a first spring force that drives the linear spring 15 to swing back to its original position.

The second end 15*b* of the linear spring 15 is formed with a guiding hook 151 protruding toward the inner wall S1 of the outer housing 11. As shown in FIG. 4, the guiding hook 151 is protruding toward the inner wall S1 of the outer housing 11 along a third direction (e.g. the Z-axis direction as shown in the Figs) thus to be accommodated in the guiding groove 112 (FIG. 3).

Refer to FIG. 2A to FIG. 2B and FIG. 5A to FIG. 5D, wherein FIG. 5A to FIG. 5D show a guiding hook's movement along an outer edge of a protrusion of the pressable portable storage device of FIG. 1. The guiding hook 151 is configured to move along the outer edge of the protrusion 111 from a first position to a second position and be engaged at the second position, or to move along the outer edge of the protrusion 111 from the second position back to the first position. To put it concretely, when the linear spring 15 stays at its original position, the guiding hook 151 stays at the first position. When the pressing portion 132 is pushed to drive the inner housing 13 to slide along the second direction (e.g. the X-axis direction as shown in the Figs) toward the terminal port 121 to sleeve the terminal port 121, the elastic unit 14 is deformed to provide the second spring force (driving the inner housing 13 away from the terminal port 121) to the inner housing 13, the guiding hook 151 is driven to abut the first ramp E2 and move along the first ramp E2, and the liner spring 15 is driven to swing along the first direction (e.g. the Y-axis direction as shown in the Figures) and deformed thereby for providing the first spring force (restoring force of the linear spring 15). When the guiding hook 151 moves past the first ramp E2, the guiding hook 151 is driven to move downward by the first spring force and toward the indented face E1, and the guiding hook 151 moves into the indented face E1 and is engaged there, (i.e. the guiding hook 151 stays at the second position) holding the inner housing 13 in place against the second spring force provided by the elastic unit 14.

When the pressing portion 132 is pushed again toward the terminal port 121, the guiding hook 151 moving past the indented face E1 is further driven downward by the first spring force and disengaged from the indented face E1. When the guiding hook 151 is disengaged from the indented face E1, the second spring force of the elastic unit 14 drives the inner housing 13 away from the terminal port 121 along the second direction to expose the terminal port 121, and the guiding hook 151 is driven to abut the second ramp E3 and move along the second ramp E3 and back to the first position. When the guiding hook 151 moves past the second ramp E3, the guiding hook 151 is driven upward by the first spring force of the linear spring 15 toward the non-deformed position, and the inner housing 13 is driven by the elastic unit 14 to stay at the original position to expose the terminal port 121.

In the present embodiment, the inner wall S1 of the outer housing 11 is further formed with another protrusion 116. The protrusions 111, 116 are protruding from the inner wall S1 of the outer housing 11 and into the sliding space, and the protrusion 116 is arranged proximal to the indented face E1 of the protrusion 111. When the guiding hook 151 moves past the first ramp E2, the protrusion 116 can facilitate the guiding hook 151 to move toward the intended face E1, thereby the protrusion 116 can facilitate the engagement of the guiding hook 151 at the indented face E1 and prevent the guiding hook 151 moving past the first ramp E2 from moving directly past the intended face E1.

In accordance with the instant embodiment, the present disclosure provides a pressable portable storage device 1. When the inner housing 13 or the pressing portion 131 thereof is pushed, the inner housing 13 slides toward the terminal port 121 and projects outside the outer housing 11 from the opening 113 of the front end 11*a* of the outer housing 11 to sleeve the terminal port 121 for protecting the terminal port 121; when the inner housing 13 or the pressing portion 131 thereof is pushed again, the inner housing 13 slides away from the terminal port 121 and is retracted within the outer housing 11, and the terminal port 121 is exposed for connection to other connectors.

Moreover, the main body 12 is fixedly connected to the outer housing 11, thus when the user handholds the outer housing 11 of the pressable portable storage device 1 and plugs the terminal port 121 to the connector of another electronic device (such as a computer), the user can apply the force directly to the outer housing 11, and the inner housing 13, which is slidably accommodated between the main body 12 and the outer housing 11 will not move due to the force applied to the outer housing 11 or the main body 12 or hinder the plugging of the terminal port 121.

In addition, the main body 12 is fixedly connected to the outer housing 11, thus when the user applies a force to the outer housing 11 for pulling the plugged terminal port 121 out of the connector of another electronic device, the terminal port 121 will not be triggered to move relative with respect to the outer housing 11 or retract within the outer housing 11. Similarly, when the user applies a force to the outer housing 11 for pulling the plugged terminal port 121 out of the connector of another electronic device, the inner housing 13 will not be triggered to move relative with respect to the outer housing 11. Therefore, when the user unplugs the pressable portable storage device 1 from one electronic device for plugging the pressable portable storage device 1 to another electronic device, since the unplugged terminal port 121 is already exposed for connection, there is no need to press the pressing portion 131 for driving the inner housing 13 away from the terminal port 121.

In other words, the inner housing 13 is driven to slide (toward or away from the terminal port 121) merely by the push on the pressing portion 131. When the user applies a force to the outer housing 11 (for plugging or unplugging the terminal port 121), the inner housing 13 will not be driven to move relative with respect to the outer housing 11.

In an exemplary embodiment not shown in the Figures, the outer wall S2 of the inner housing 13 is formed merely with one guiding lever 133 protruding from the outer wall S2, and the inner wall S1 of the outer housing 22 can be formed with another guiding lever 133 protruding from the inner wall S1. The two guiding levers 133 are positioned side by side for clamping the first end 15*a* of the linear spring 15, whereby the first end 15*a* of the linear spring 15 is fixedly connected to the inner housing 13. When the guiding hook 151 is driven to abut the first ramp E2 and move along the first ramp E2, and the linear spring 15 is driven to swing along the first direction, the guiding lever 133 protruding from the inner wall S1 may hinder the swing of the liner spring 15, so that the first spring force provided by the liner spring 15 is increased.

In another exemplary embodiment not shown in the Figs, the outer wall S2 of the inner housing 13 is formed with a fixing aperture, and the first end 15*a* of the linear spring 15 is formed with a fixing hook fixedly engaged at the fixing aperture. Furthermore, the inner wall S1 of the outer housing is formed with a protrusion positioned at a side of the linear spring 15. When the guiding hook 151 is driven to abut the first ramp E2 and move along the first ramp E2, and the linear spring 15 is driven to swing along the first direction, the protrusion protruding from the inner wall S1 may hinder the swing of the linear spring 15, so that the first spring force provided by the linear spring 15 is increased.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A pressable portable storage device, comprising:

an outer housing having an inner wall formed with a protrusion, wherein the protrusion has an end formed with an indented face;

a main body fixedly accommodated inside the outer housing, wherein the main body has a terminal port and at least one fixing portion, the terminal port is exposed outside the outer housing, and the main body is fixedly connected to the outer housing through the fixing portion;

an inner housing slidably accommodated in a sliding space between the main body and the outer housing;

an elastic unit connected between the main body and the inner housing; and a linear spring having a first end and a second end, wherein the first end is fixedly connected to the inner housing, the second end is formed with a guiding hook protruding toward the inner wall of the outer housing, and the linear spring is configured to swing along a first direction;

wherein when the inner housing slides along a second direction to sleeve the terminal port, the guiding hook moves along an outer edge of the protrusion to drive the linear spring to swing along the first direction to deform for providing a first spring force and the elastic unit provides a second spring force to the inner housing.

2. The pressable portable storage device of claim 1, wherein the inner housing has at least one sliding slot, the fixing portion of the main body is positioned in the sliding slot, and the fixing portion slides in the sliding slot along the second direction to move relative with respect to the inner housing when the inner housing slides along the second direction.

3. The pressable portable storage device of claim 2, wherein the main body has two of the fixing portions, the inner housing has two of the sliding slots, and the two sliding slots are respectively positioned at two sides of the inner housing.

4. The pressable portable storage device of claim 1, wherein the elastic unit sleeves the main body and the elastic unit is disposed between the main body and the inner housing.

5. The pressable portable storage device of claim 1, wherein the guiding hook protrudes toward the inner wall of the outer housing along a third direction, and the first direction, the second direction, and the third direction are perpendicular to one another.

6. The pressable portable storage device of claim 1, wherein the inner housing has a pressing portion exposed outside the outer housing, the pressing portion is positioned at a first end of the outer housing, and the terminal portion is positioned at a second end of the outer housing.

7. The pressable portable storage device of claim 6, wherein the outer edge of the protrusion is formed with a first ramp and a second ramp and the indented face is connected between the first ramp and the second ramp.

8. The pressable portable storage device of claim 7, wherein the guiding hook is engaged at the indented face when the pressing portion is pressed toward the terminal port.

9. The pressable portable storage device of claim 8, wherein the guiding hook is disengaged from the intended face when the pressing portion is pressed again toward the terminal port.

10. The pressable portable storage device of claim 9, wherein the guiding hook is driven to move along the second ramp by the second spring force and the inner housing is driven to slide away from the terminal port along the second direction by the second spring force to expose the terminal port when the guiding hook is disengaged from the intended face.

* * * * *